(12) United States Patent
Yashiki et al.

(10) Patent No.: US 7,132,923 B2
(45) Date of Patent: Nov. 7, 2006

(54) MEMORY REWRITING SYSTEM FOR VEHICLE CONTROLLER

(75) Inventors: Tetsuya Yashiki, Wako (JP); Masanori Matsuura, Wako (JP); Naohiko Mizuo, Wako (JP)

(73) Assignee: Honda Giken Kogyo Kabushiki Kaisha, Tokyo (JP)

( * ) Notice: Subject to any disclaimer, the term of this patent is extended or adjusted under 35 U.S.C. 154(b) by 378 days.

(21) Appl. No.: 09/800,814

(22) Filed: Mar. 7, 2001

(65) Prior Publication Data

US 2001/0023485 A1    Sep. 20, 2001

(30) Foreign Application Priority Data

Mar. 16, 2000   (JP)   ............................. 2000-074236

(51) Int. Cl.
  G05B 19/00    (2006.01)
(52) U.S. Cl. .................................................. 340/5.21
(58) Field of Classification Search ............... 340/5.21, 340/5.62, 5.26, 5.2, 5.22–5.25, 10.51–10.52, 340/426.35, 825.57, 5.64, 5.72, 5.65; 701/1, 701/29, 32, 35, 115; 713/182, 189, 191, 713/200, 2; 380/28, 241; 711/103, 154; 307/10.2, 10, 10.1, 5; 180/287
  See application file for complete search history.

(56) References Cited

U.S. PATENT DOCUMENTS

| | | | | |
|---|---|---|---|---|
| 5,621,380 | A * | 4/1997 | Mutoh et al. | 340/426.35 |
| 5,677,680 | A * | 10/1997 | Yoda | 340/825.57 |
| 5,787,367 | A * | 7/1998 | Berra | 701/1 |
| 5,826,211 | A * | 10/1998 | Kobayashi | 701/115 |
| 5,886,421 | A * | 3/1999 | Mizuno et al. | 307/10.5 |
| 5,945,906 | A * | 8/1999 | Onuma | 340/5.62 |
| 6,160,488 | A * | 12/2000 | Honda | 340/5.65 |
| 6,163,271 | A * | 12/2000 | Yoshizawa et al. | 340/5.26 |
| 6,285,948 | B1 * | 9/2001 | Takagi et al. | 701/115 |
| 6,401,207 | B1 * | 6/2002 | Funakoshi et al. | 713/182 |

FOREIGN PATENT DOCUMENTS

EP    759 385 A2    2/1997

(Continued)

OTHER PUBLICATIONS

Office Action, European Patent Office to 01 106 564.6-2210, Feb. 4, 2003.

(Continued)

Primary Examiner—Wendy R. Garber
Assistant Examiner—William Bangachon
(74) Attorney, Agent, or Firm—Lahive & Cockfield, LLP; Anthony A. Laurentano, Esq.

(57) ABSTRACT

A memory rewriting system for a vehicle controller is provided. The system comprises a vehicle controller and an external rewriting device. A vehicle controller comprises a rewritable memory storing first security data. The first security data is used to determine whether rewriting to the rewritable memory is permitted. The rewriting device transfers new security data to the vehicle controller. The vehicle controller deletes the first security data and writes the new security data into the rewritable memory. Rewriting the new security data is performed by a program stored in a non-rewritable memory. Thus, the security data that is used to determine whether rewriting to the rewitable memory is permitted is rewritten with the new security data. Therefore, if the existing security data stored in the vehicle controller is invalidated, the security feature of the vehicle can be recovered. The vehicle may includes an anti-theft system. In this case, rewriting to the rewritable memory is permitted if the anti-theft system permits an operation as to the vehicle.

11 Claims, 10 Drawing Sheets

FOREIGN PATENT DOCUMENTS

| | | |
|---|---|---|
| EP | 759 385 A3 | 2/1997 |
| EP | 762 249 A1 | 3/1997 |
| EP | 870 889 A2 | 10/1998 |
| EP | 870 889 A3 | 10/1998 |
| JP | 63-223901 | 9/1988 |
| JP | 3-238541 | 10/1991 |
| JP | 05-311935 | 11/1993 |
| JP | 09-044216 | 2/1997 |

OTHER PUBLICATIONS

Office Action, European Patent Office to 01 106 564.6-2210, Jul. 7, 2003.

* cited by examiner

MEMORY REWRITING SYSTEM FOR VEHICLE CONTROLLER

FIELD OF THE INVENTION

The present invention relates to a memory rewriting system for rewriting data stored in a memory of a vehicle controller with another data transferred from an external rewriting device.

BACKGROUND OF THE INVENTION

Vehicles are subjected to various types of control by an electronic control unit (hereafter referred to as "ECU") Such control includes engine-related control for an air fuel ratio, fuel injection amount, and emission as well as body-related control for a power window, an air bag, and an ABS. The ECU provides various types of control for the vehicle based on current conditions and traveling status of the vehicle sensed by various sensors mounted on the vehicle.

On the other hand, the vehicle may include an anti-theft system. In general, the anti-theft system electronically checks if an ignition key used by a driver to start the engine is authentic. If it is determined that the key is authentic, the anti-theft system transfers a signal for permitting vehicle operation to the ECU. On the other hand, if it is determined that the ignition key is not authentic, the driver is judged to be not an authorized person and cannot operate the vehicle. Thus, until the permission signal is received, the ECU does not allow the engine to start by, for example, stopping fuel injection.

The ECU comprises a central processing unit (CPU), a ROM (Read Only Memory) that stores programs and data to be executed, a RAM (Random Access Memory) which provides a work area for execution and which stores results of computation, and an I/O interface for receiving signals from various sensors and transmitting control signals to various parts of the engine.

The ROM often includes a rewritable memory such as a flash memory, an EEPROM, or an EPROM to allow a program or data therein to be rewritten. Japanese Patent Application Laid-Open No. 63-223901 describes a method for changing a program stored in the EEPROM of the ECU in response to a request from an external device with the ECU being mounted on the vehicle.

Such a function of changing a program or data stored in a ROM of the ECU makes it necessary to protect them from access from an external device, thus preventing a user or other third parties from rewriting a program or data stored in the ROM without proper authorization. Japanese Patent Application Laid-Open No. 3-238541 describes a vehicle controller for determining that a program or data in a ROM of the ECU is tampered using a check data mechanism. According to the mechanism, check data based on data stored in the ROM are stored beforehand. After shipment of the vehicle, the ECU creates new check data based on the data stored in the ROM. The ECU then compares the new check data with the previously stored check data, determines that the data have been tampered if they are unequal and turns on the alarm light.

A key for releasing the above-mentioned security feature is known only to a manufacturer of a rewriting device under contract to the automobile manufacturer. Thus, only the rewriting device authorized by the automobile manufacturer can use the "key" and change the data stored in the ROM of the ECU of that automobile.

A typical procedure for changing a program in the ROM will be described in brief. The above-mentioned key is typically expressed by a certain function, which is provided both in the rewriting device and in the ECU. The rewriting device is connected to the ECU and then uses its own function (i.e., key) to calculate a function value for an arbitrary numerical value transmitted from the ECU. The rewriting device then transfers the function value to the ECU. At the same time, the ECU uses its own function (i.e.,key) to calculate a function value for the same numerical value. The ECU compares the function value received from the rewriting device with the function value determined by itself. If they are equal, the ECU releases the security feature. Thus, the rewriting device is permitted to rewrite data stored in the ROM. If they are unequal, then the rewriting device is judged to be not authentic because the rewriting device and the ECU have different functions (keys). Consequently, the security feature is not released and the rewriting device cannot rewrite the data stored in the ROM.

The key for releasing the security feature, however, is conventionally stored in a non-rewritable area of the ROM in the ECU, so that it is impossible to use the rewriting device to change the key after the vehicle has been shipped. Thus, if the key is accidentally divulged to a user or another third party who is not authorized, a rewriting device other than the authorized one can rewrite the key in the ROM, thereby breaking the security feature.

On the other hand, if the vehicle includes an anti-theft system and if a program used to operate the anti-theft system is rewritten, then the anti-theft system would be invalidated. Accordingly, a system for rewriting a program or data stored in the ROM requires higher security than that for the anti-theft system.

SUMMARY OF THE INVENTION

An object of the present invention is to provide a memory rewriting system for a vehicle controller which enables, even after shipment of the vehicle, changing of a key for releasing a security feature that prevents a program or data stored in the ROM of the ECU from being tampered. Even if the key has been divulged to a third party who is not authorized, the manufacturer can use the rewriting device to change the key, thus enabling the security feature to be easily recovered.

Another object of the present invention is to provide a memory rewriting system for a vehicle controller which can operate in cooperation with an anti-theft system.

According to one aspect of the invention, a vehicle controller comprising a rewritable memory is provided. The rewritable memory stores first security data that is used to determine whether rewriting to the rewritable memory is permitted. The vehicle controller is configured, in response to receipt of new security data from an external rewriting device, to delete the first security data, and to write the new security data into the rewritable memory. The rewritable memory can be implemented in a non-volatile memory such as a flash memory, EPROM, and EEPROM. Thus, the security feature can be easily recovered by rewriting the security data stored in the rewritable memory, preventing illegal rewriting from spreading even if the security data has been divulged to a third party.

In one embodiment of the invention, the vehicle controller also comprises a non-rewritable memory, in which a program for deleting the first security data and writing the new security data is stored. Thus, a program that rewrites security data is prevented from tampering.

In another embodiment of the invention, the rewritable memory and the non-rewritable memory are implemented in a single memory.

In another embodiment of the invention, an anti-theft system is connected to the vehicle controller. In this case, rewriting to the rewritable memory is permitted if the anti-theft system permits an operation as to the vehicle.

According to another aspect of the invention, a rewriting device for rewriting a rewritable memory included in a vehicle controller is provided. The rewriting device comprises a memory for storing new security data and a communication means for transferring the new security data. The transferred new security data is written into the rewritable memory. The new security data written in the rewritable memory is used to determine whether rewriting to the rewritable memory is permitted. The rewriting device provides an user interface that enables a user to create the new security data. Moreover, the controller can assemble data blocks from the new security data. Each data block includes a program code field for partial program code of the new security data and an address field for a leading address of the rewritable memory in which the partial program code is to be stored. The communication means transfers the data blocks via serial communication.

In one embodiment of the invention, the rewriting device further issues a request to the vehicle controller to delete the first security data and write the transferred new security data into the rewritable memory.

According to another aspect of the invention, the rewriting device stores second security data. The vehicle controller compares a first security data stored in a rewritable memory mounted therein with the second security data transferred from the rewriting device. The vehicle controller permit the rewriting device to rewrite to the rewritable memory if the first security data matches the second security data.

In one embodiment of the invention, the first security data and the second security data have the same function. The rewriting device includes a program to calculate a first function value for a number based on the function of the first security data. The vehicle controller calculates a second function value for the number based on the function of the second security data. The vehicle controller compares the first function value with the second function value transferred from the rewriting device. If the first function value is equal to the second function value, the vehicle controller permits the rewriting device to rewrite to the rewritable memory.

DETAILED DESCRIPTION OF THE PREFERRED EMBODIMENTS

The present invention for rewriting a security program stored in a non-volatile memory of a vehicle controller will be described referring to attached drawings. The present invention, however, is not limited to the system for rewriting the security program but is applicable to various systems for rewriting data stored in a non-volatile memory.

Figure 1:
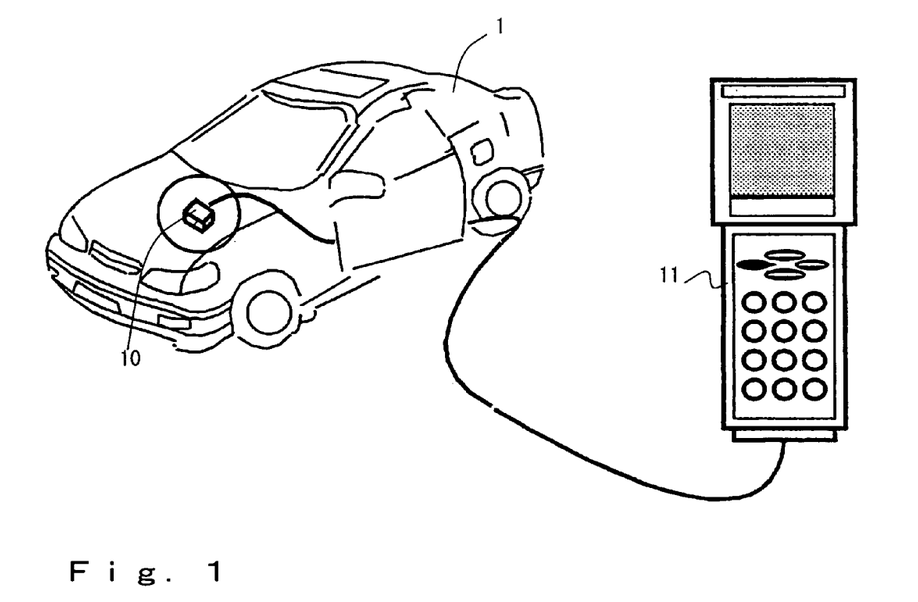
FIG. 1 is a view showing an outline of a memory rewriting system according to one embodiment of the present invention.

FIG. 1 shows an outline of a memory rewriting system according to one embodiment of the present invention. The memory rewriting system comprises an electronic control unit (ECU) 10 mounted on a vehicle 1 and a rewriting device 11. The rewriting device 11 is authorized by the manufacturer of the vehicle 1. The ECU 10 comprises a rewritable ROM (not shown). As shown in the figure, when the rewriting device 11 is connected to the ECU 10 and some appropriate operation to the rewriting device 11 is performed, a security feature for preventing a program or data stored in the ROM of the ECU 10 from being rewritten without proper authorization is released, Thus, the rewriting device is allowed to rewrite the program or data stored in the ROM.

Rewriting is executed via serial communication between the ECU 10 and the rewriting device 11. A user can send data for rewriting to the ECU 10 by operating buttons on the rewriting device 11 and/or interacting with a display screen provided on the rewriting device 11. The rewriting device, however, is not limited to the form shown in the figure, but may be of another form having a protocol that enables communication with the ECU 10.

Figure 2:
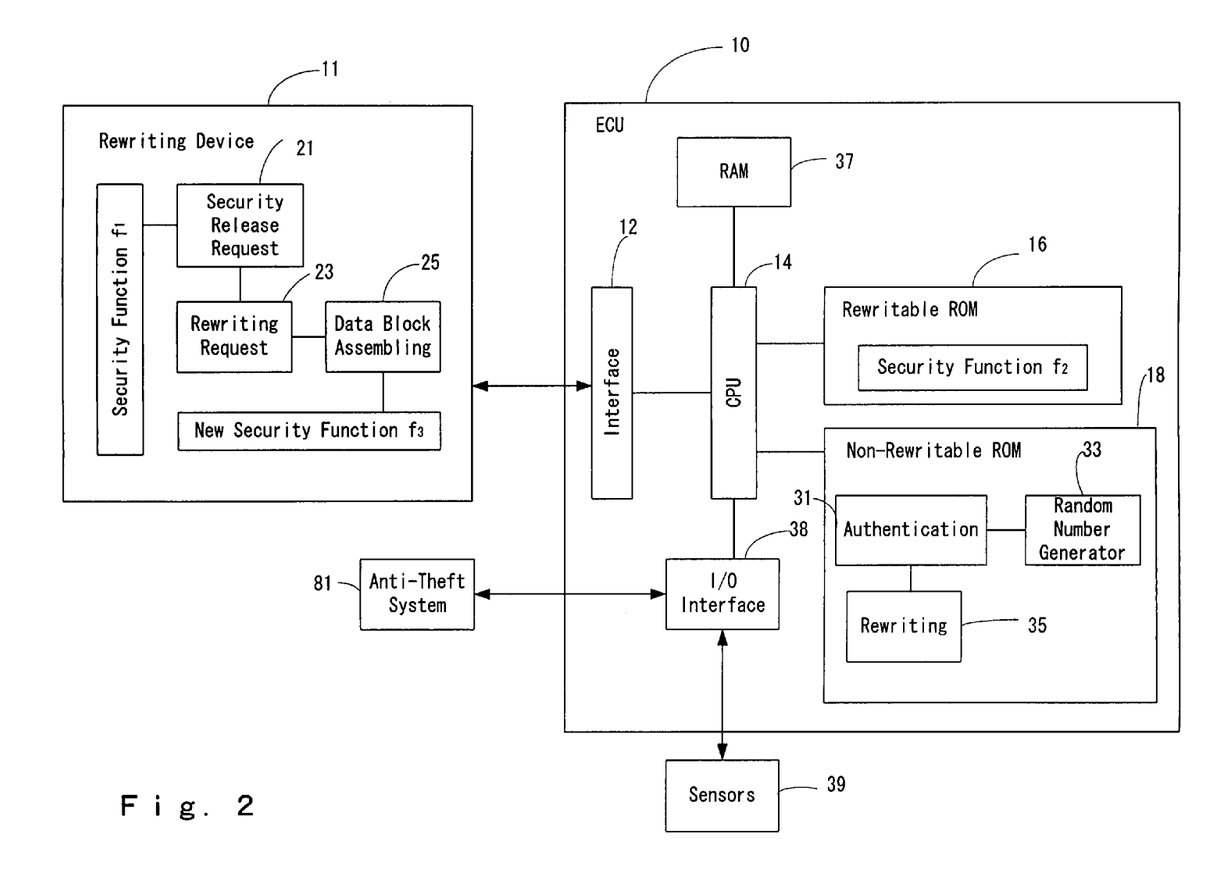
FIG. 2 is a block diagram showing the entire memory rewriting system according to one embodiment of the present invention.

FIG. 2 is a functional block diagram showing the entire memory rewriting system according to one embodiment of the present invention. As described above, the memory rewriting system comprises the ECU 10 mounted on the vehicle and the rewriting device 11. The rewriting device 11 is provided outside the ECU 10 and connected thereto via serial communication. Alternatively, parallel communication may be used between the rewriting device 11 and the ECU 10.

The ECU 10 comprises a central processing unit 14 (hereafter referred to as a "CPU") including a microcomputer and associated circuit elements, ROMs 16 and 18 which are non-volatile memories and which store programs and data, a RAM 37 (Random Access Memory) which provides a work area for execution and which stores results of computations, and an I/O interface 38 for receiving signals from various sensors 39 and transmitting control signals to various parts of the engine. Signals from various sensors 39 include an engine rotation speed (Ne), an engine water temperature (Tw), an intake air temperature (Ta), a battery voltage (VB), and an ignition switch (IGSW). Thus, based on a signal input from the I/O interface 38, the CPU 14 invokes a control program and data from the ROMs 16 and 18 to execute computations, and outputs the results to various parts of the vehicle via the I/O interface 38 to control various functions of the vehicle.

The ECU 10 also comprises an interface 12. The interface 12 has a protocol for communication with the rewriting device 11 to enable serial communication between the ECU 10 and the rewriting device 11.

The rewritable ROM 16 is a memory from and to which stored data can be deleted and new data can be written The rewritable ROM 16 can be, for example, a flash memory or an EEPROM. The non-rewritable ROM 18 can be implemented by specifying a part of the memory area of the rewritable ROM as an unchangeable area, or by using a mask ROM for which data are fixed during manufacturing and from or to which data can subsequently not be deleted or written. Alternatively, the ROM 18 can be implemented with a PROM to which data can be written only once.

Figure 2A:
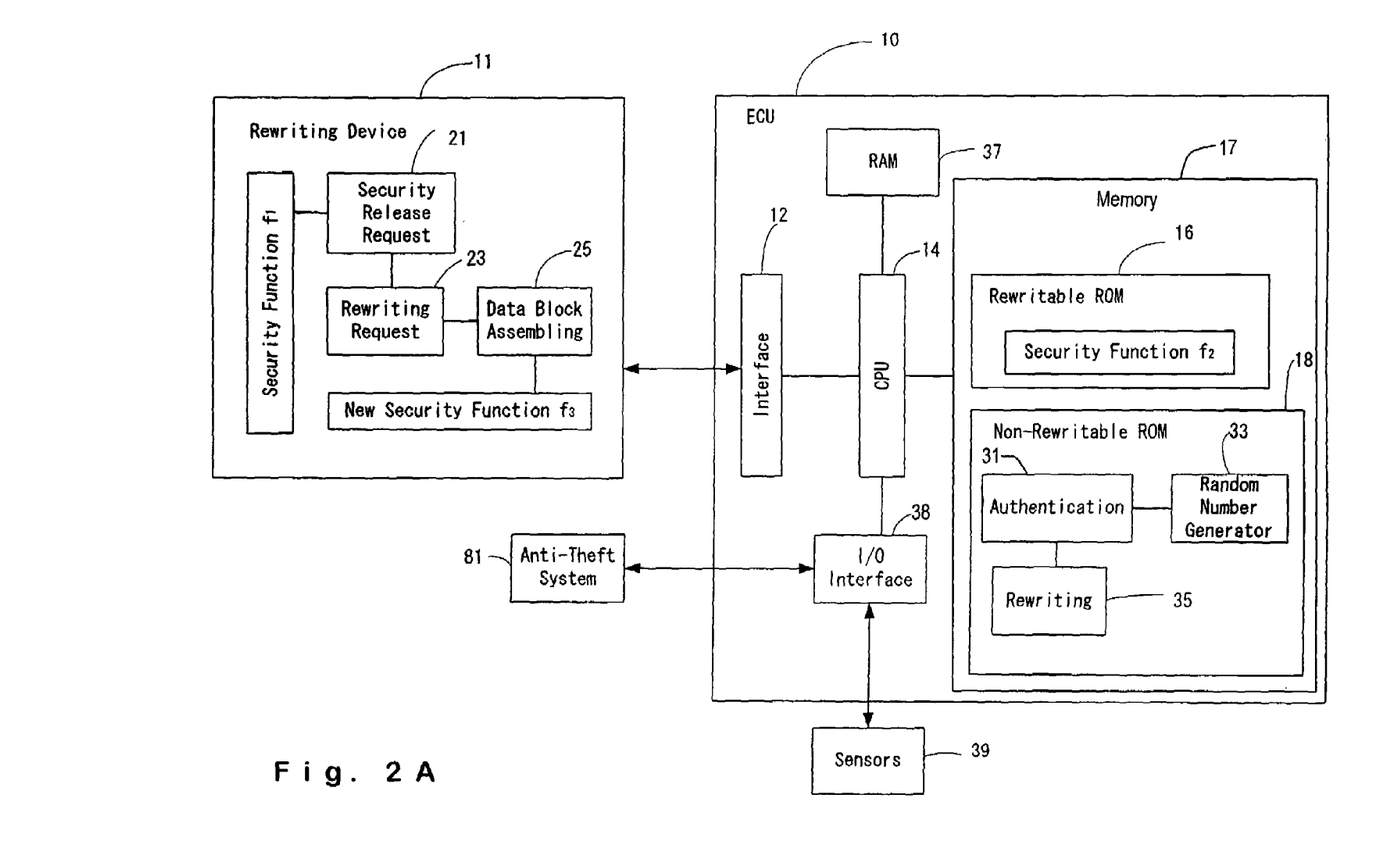
FIG. 2A is a block diagram showing the entire memory rewriting system according to another embodiment of the present invention.

The ROMs 16 and 18 can be implemented as two memories that are physically separated. Alternatively, FIG. 2A illustrates the memory area of a single memory 17 may be divided into two areas so that one of the areas is used as a rewritable area, while the other is used as a non-rewritable area. In the latter case, for example, after a non-rewritable area in which a program or the like is stored has been specified in the EEPROM, a rewritable area is specified with a start address and an end address in the unfilled space of the memory.

Now, examples of a form of the ROMs 16 and 18 and CPU will be described with reference to FIG. 3. In this figure, the ROMs 16 and 18 are implemented using a flash memory. FIG. 3(a) shows a form in which the flash memory is provided separately from the CPU. When a rewriting operation mode is entered through communication with the rewriting device 11, the CPU receives data from the rewriting device 11, and invokes a program for rewriting the flash memory with the received data.

Figure 3:
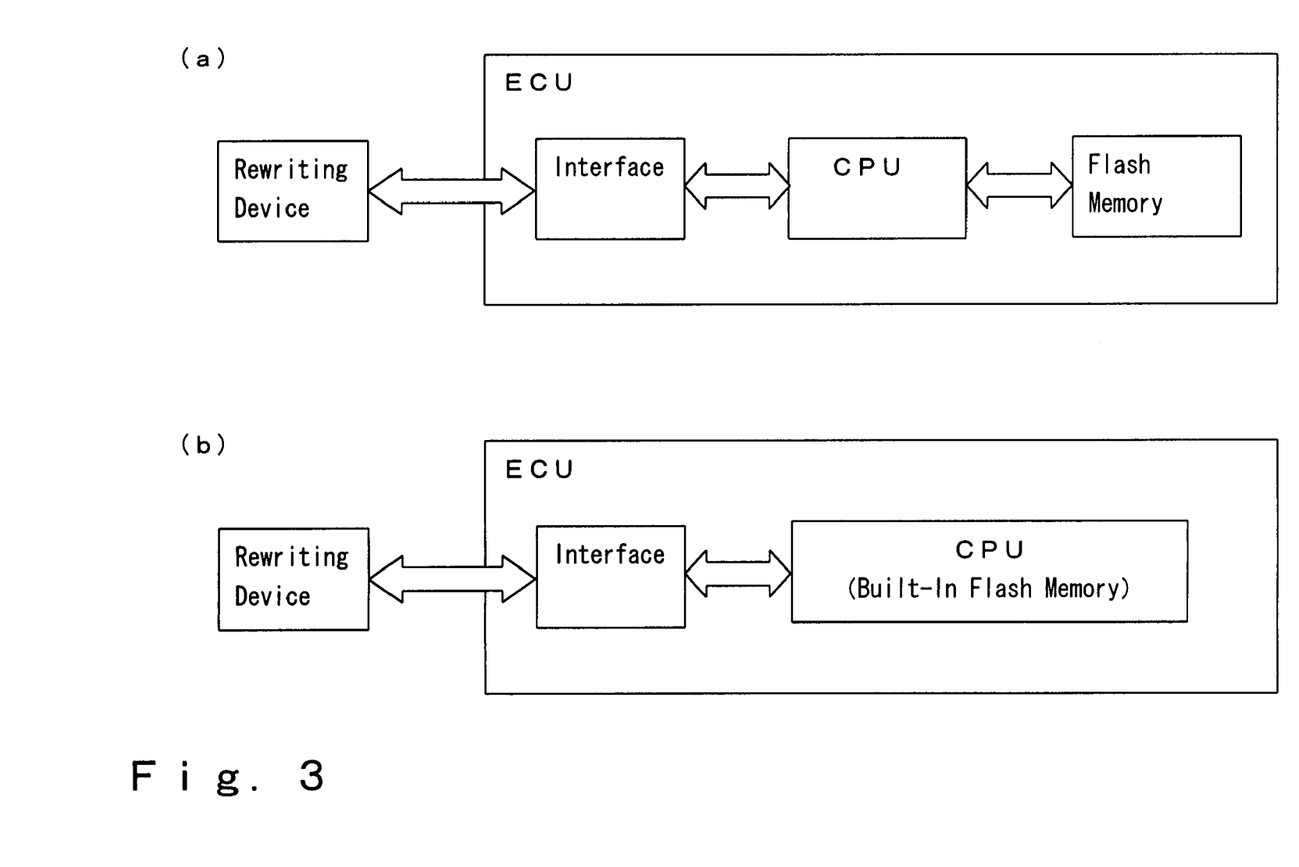
FIG. 3 is a view showing examples of a form of a ROM and a CPU of the ECU in the memory rewriting system according to one embodiment of the present invention.

On the other hand, FIG. 3(b) shows a form having a built-in flash memory that constitutes one chip in conjunction with the CPU. When the rewriting operation mode is entered in response to a signal from the rewriting device, data transferred from the rewriting device is automatically written to the flash memory using a function incorporated in the CPU. The memory rewriting system according to the present invention is applicable to either of the above forms.

Referring back to FIG. 2, the rewritable ROM 16 stores a security function $f_2$. The security function $f_2$ realizes a security feature for preventing the data stored in the ROM 16 from being illegally rewritten.

The non-rewritable ROM 18 stores programs for implementing an authentication part 31, a random number generator 33, and a rewriting part 35. The authentication part 31 is responsive to a request for releasing security from the rewriting device 11, and determines whether the rewriting device 11 is authentic using the security function $f_2$ and a random number R which is generated by the random number generator 33. Using the random number R enables the security feature to be enhanced. If it is determined that the rewriting device is authentic, the authentication part 31 releases the security feature.

After that, the rewriting part 35 deletes the security function $f_2$ and receives a new security function $f_3$ from the rewriting device 11 to write it into the ROM 16. The security function $f_2$ may be physically or logically deleted. The logically deletion may be implemented using a deletion flag. More specifically, the security function $f_2$ with the deletion flag being set is considered to be deleted in subsequent processes.

The rewriting device 11 has a security function $f_1$ and a new security function $f_3$. The security function $f_1$ implements the security feature in cooperation with the security function $f_2$ stored in the ROM 16 of the ECU 10. If the security function $f_2$ has not been changed by any third person, the security function $f_1$ of the rewriting device 11 is the same as the security function $f_2$ of the ECU 10. In another embodiment, the security functions $f_1$ and $f_2$ have a certain relationship. If the relationship is kept, it is determined that the security functions $f_2$ has not been tampered.

The new security function $f_3$ is prepared prior to rewriting the security function $f_2$ stored in the ROM 16. The new security function $f_3$ can be created by making certain changes to the current security functions $f_1$. According to one example, the new security function $f_3$ is a function that has a different expression from the security functions $f_1$. According to another example, the new security function $f_3$ is a function that has different constant(s) in the function expression from the security functions $f_1$. For example, when the functions $f_1$ and $f_2$ are $f_1=f_2=A \times R+B$ (A=10 and B=5), the new security function $f_3$ is set such that $f_3=A+R \times B$ (A=10 and B=5). Alternatively, the values of the constants A and B of the functions $f_1$ and $f_2$ may be changed to 5 and 10, respectively.

The rewriting device 11 also comprises a security release request part 21, a rewriting request part 23, and a data block assembling part 25, which may be stored in a memory of the rewriting device 11 as programs. The security release request part 21 uses the security functions $f_1$ to request the ECU 10 to release the security feature.

The data block assembling part 25 assembles data blocks suitable for serial communication from program code of the security function $f_3$. Each data block includes an address field and a program code field. The program code field contains a partial program code and the address field contains a leading address of an area in which the partial program code is to be stored. The data block assembling part 25 divides the program code of the security function $f_3$ into a plurality of pieces, each of which having a certain length (for example, 8 bits). Each piece of the program code, or each partial program code, is placed in the program code field of a data block. A leading address of each partial program code is placed in the address field of the data block. Thus, the data block is assembled.

The rewriting request part 23 serially transfers to the ECU 10 the data blocks representative of the new security function $f_3$ assembled by the data block assembling part 25 after the security feature has been released.

An anti-theft system 81 is connected to the ECU 10 so that the memory rewriting system can exchange information with the anti-theft system 81. The anti-theft system 81 extracts an electronic code from an ignition key inserted into a key cylinder when the engine is to be started and compares the electronic code with a predetermined authorized code to check whether the inserted ignition key is authentic. If it is determined that the ignition key is authentic, the anti-theft system 81 transfers a signal indicative of a permission for engine start to the ECU 10 via an I/O interface 38. Upon receiving this permission signal, the ECU 10 set an engine start permission flag which may be stored in the RAM 37 or ROM 16, and starts the engine. If it is determined that the inserted ignition key is not authentic, the permission signal is not output. Accordingly, the ECU 10 cannot start the engine. Although the anti-theft system 81 and the ECU 10 are separately shown in FIG. 2, some of the functions of the anti-theft system 81 maybe included in the ECU 10. For example, the authorization of the ignition key may be performed by the ECU 10.

The operation of the memory rewriting system shown in FIG. 2 is described with reference to FIGS. 4 and 5. Rewriting operation is initiated, for example, when an operation button of the rewriting device 11 is pressed after the rewriting device 11 has been connected to the ECU 10. Alternatively, the rewriting operation may be initiated by operating the ECU 10.

At step 41, the security release request part 21 of the rewriting device 11 transfers a signal indicative of a request for releasing security to the ECU 10. The ECU 10 responds to this signal to start an authentication process for confirming that the authorized rewriting device is connected thereto. The authentication process will be described below referring to FIG. 5.

If the ECU authenticates the rewriting device 11 and permits it to rewrite to the rewritable ROM 16, the process proceeds to step 42. The rewriting request part 23 of the rewriting device 11 transfers a signal indicative of a start of rewriting to the ECU 10, and the rewriting part 35 of the ECU 10 returns a start permission signal when ready for rewriting. At step 43, the rewriting device 11 transfers a request for shifting to a rewriting operation mode to the ECU 10, and then the rewriting part 35 of the ECU 10 executes a process for shifting to the rewriting operation mode. At step 44, the rewriting request part 23 queries the ECU 10 if the shift of the operation mode has completed. The rewriting part 35 transfers a signal indicative of a completion of the shift to the rewriting device 11 if the shift has been completed.

At step 45, the rewriting request part 23 requests the security function $f_2$ stored in the rewritable ROM 16 to be deleted, and in response to this, the rewriting part 35 deletes the security function $f_2$ from the ROM 16.

At this point, in the rewriting device 11, the new security function $f_3$ has been prepared. The function $f_3$ has been provided by the data block assembling part 25 as serial data blocks for transmission to the ECU 10. The security function $f_3$ is typically created before the rewriting device 11 transfers the request for releasing security or the notification for starting of rewriting to the ECU 10. This preparation for the new security function $f_3$, however, may be carried out immediately before the step 45.

The new security function $f_3$ may be prepared, for example, selecting one from a number of functions previously saved in the rewriting device 11. Alternatively, a user may create the new security function $f_3$ by manipulating the rewriting device 11.

At step 46, the rewriting request part 23 transfers the first one of the data blocks representative of the new security function $f_3$ to the ECU 10 together with a signal indicative of a request for writing to the rewritable ROM 16. The rewriting part 35 receives the data block from the rewriting device 11 and writes a partial program code included in the data block to the rewritable ROM 16. The partial program code is written in an address that is indicated by the address field of the data block. Once writing of the partial program code has been completed, the rewriting part 35 transfers a notification of the completion of writing to the rewriting device 11. In response to this, the rewriting device 11 transfers a next data block to the ECU 10. This step 46 is repeated until all the program code of the security function $f_3$ is written into the ROM 16.

Once writing of all the program code has completed, the rewriting request part 23 transfers a request for releasing the rewriting operation mode to the ECU 10 (step 47). In response to this, the rewriting part 35 releases the rewriting operation mode. Since the rewriting device 11 has changed the security function stored in the ROM 16 to $f_3$, the function used by the rewriting device 11 is also set to $f_3$ so that the security feature can subsequently be implemented by means of the security function $f_3$. After the new security function $f_3$ has been written to the ROM 16, the preceding security function $f_1$ may be deleted.

Figure 4:
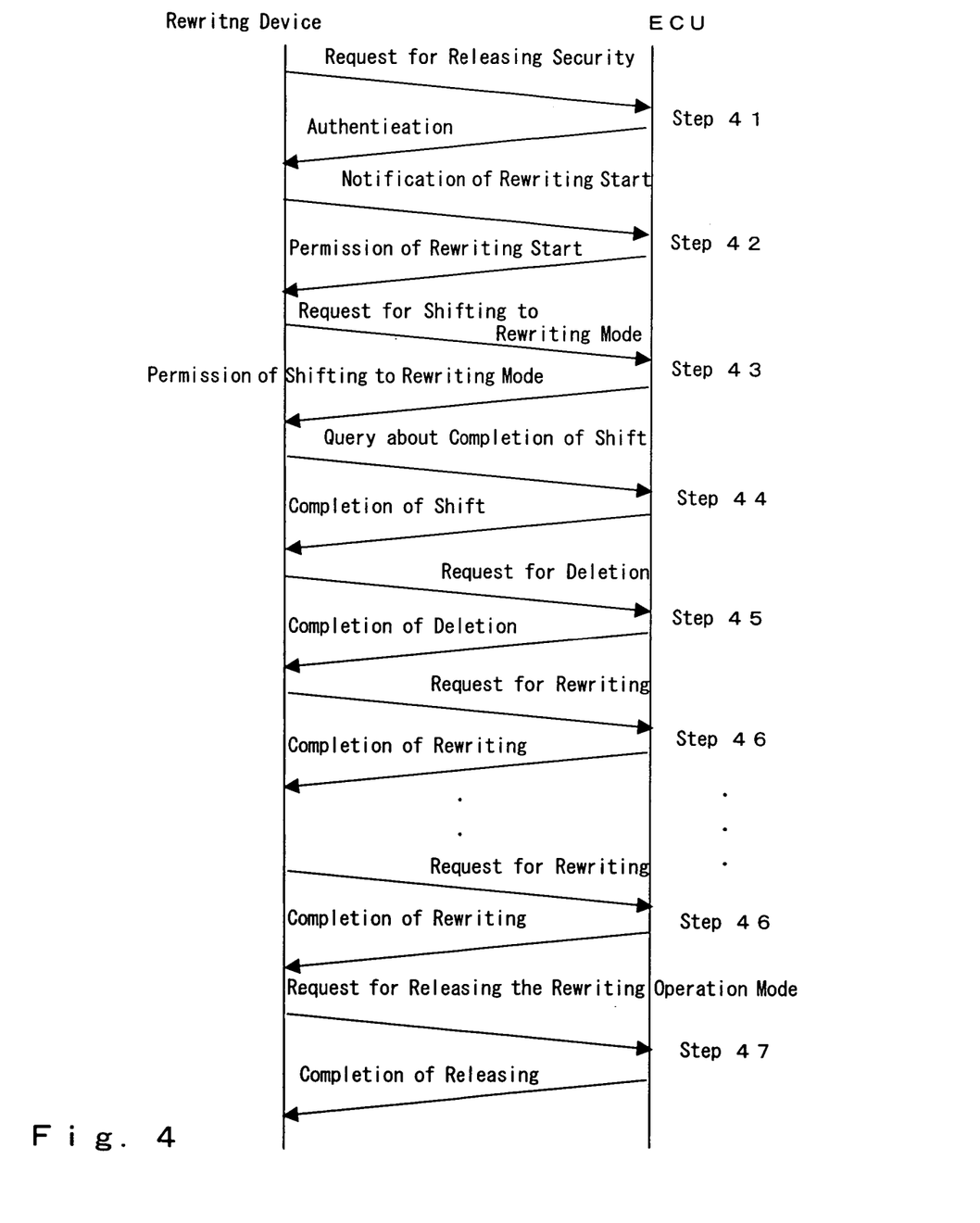
FIG. 4 is a view showing an operational procedure of the memory rewriting system according to one embodiment of the present invention.
Figure 5:
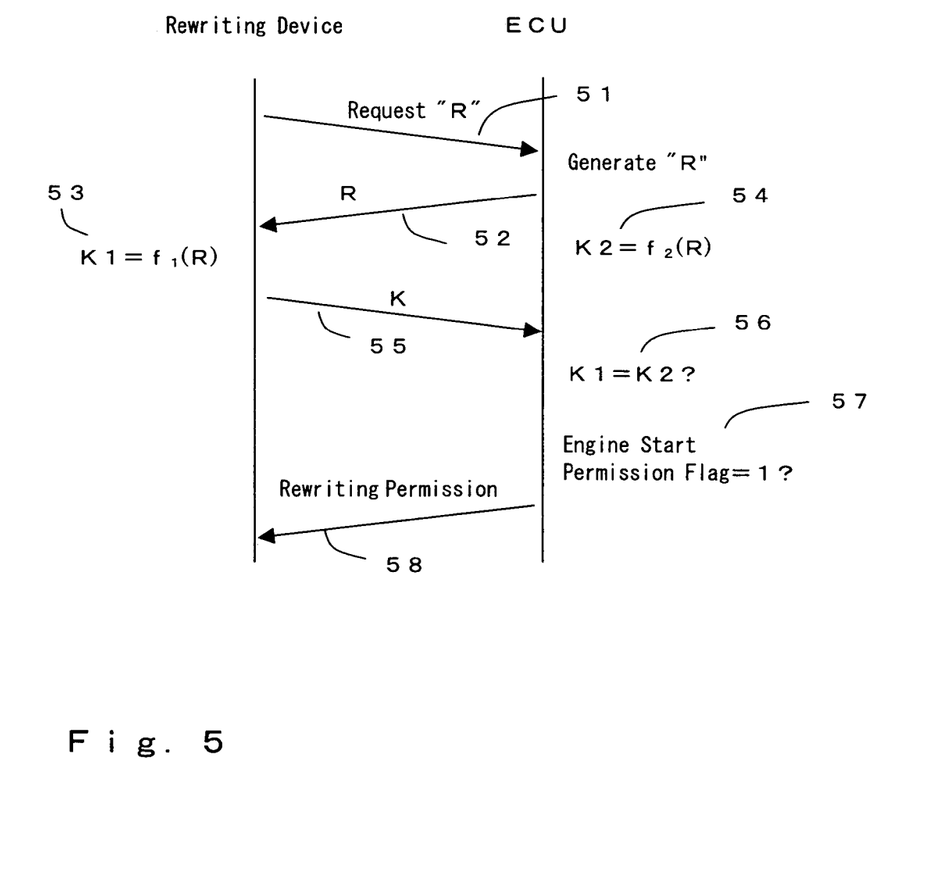
FIG. 5 is an authentication procedure executed by the memory rewriting system according to one embodiment of the present invention.

FIG. 5 shows an example of the authentication process corresponding to step 41 in FIG. 4. At step 51, the security release request part 21 of the rewriting device 11 requests the ECU 10 to transfer an arbitrary number R. In response to this, the authentication part 31 of the ECU 10 is invoked. The authentication part 31 invokes the random number generator 33 that generates random numbers. The authentication part 31 arbitrarily selects the number R from the random numbers generated by the random number generator 33, and transfers the number R to the rewriting device 11 (step 52). Alternatively, a different mechanism may be used to set the arbitrary number R. The rewriting device 11 uses the security function $f_1$ already stored therein to determine the function value K1 of the function $f_1$ for the number R based on $K1=f_1(R)$ (step 53).

On the other hand, the authentication part 31 of the ECU 10 uses the security function $f_2$ stored in the rewritable ROM 16 to determine a function value K2 based on $K2=f_2(R)$ (step 54). The security release request part 21 of the rewriting device 11 transfers the function value K1 to the ECU 10 (step 55). The authentication part 31 compares the function value K1 from the rewriting device 11 with the internally determined function value K2 (step 56), and if they are equal, determines that the rewriting device 11 is authentic. Subsequently, the authentication part 31 checks whether the engine start permission flag stored in the RAM 37 is a value of one (step 57). If the permission flag is one, this means that the engine start permission signal has been output from the anti-theft system 81, and a signal indicative of a permission of rewriting is transferred to the rewriting device 11 (step 58).

Thus, the security feature needs to be released for rewriting data stored in the rewritable ROM, so that the current security functions $f_1$ and $f_2$ are used to release the security feature. With the anti-theft system mounted in the vehicle, the security feature for the memory rewriting system is released only if the anti-theft system has been released, thereby preventing an illegal driver from rewriting data.

Figure 6:
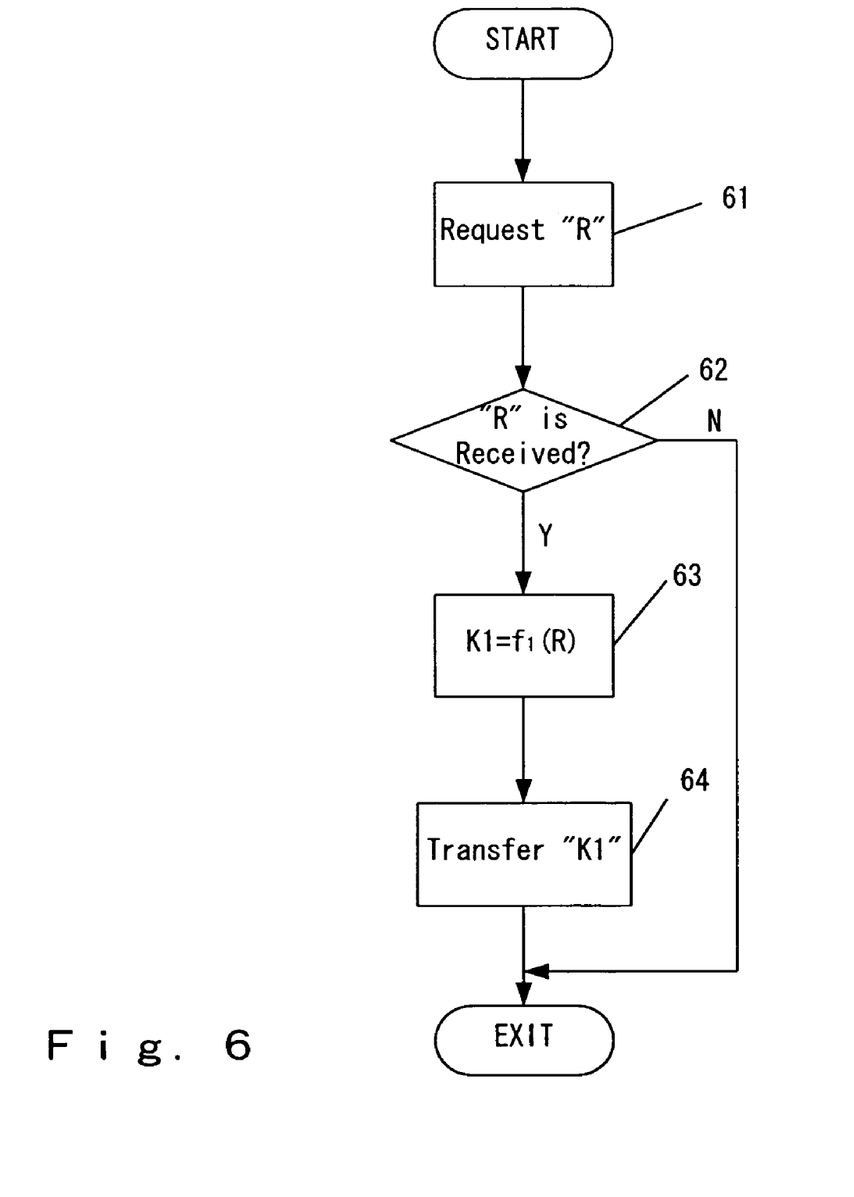
FIG. 6 is a flow chart showing a process for releasing security executed by the rewriting device of the memory rewriting system according to one embodiment of the present invention.

FIG. 6 is a flow chart showing a process for releasing security executed by the rewriting device 11. At the step 61, the rewriting device 11 requests a number R from the ECU 10. The rewriting device 11 subsequently receives the number R from the ECU 10 (step 62). Upon receiving the number R, the rewriting device 11 calculates the function value K1 for the number R using the security function $f_1$ already retained therein (step 63). Subsequently, the rewriting device 11 transfers the function value K1 to the ECU 10 (step 64).

Figure 7:
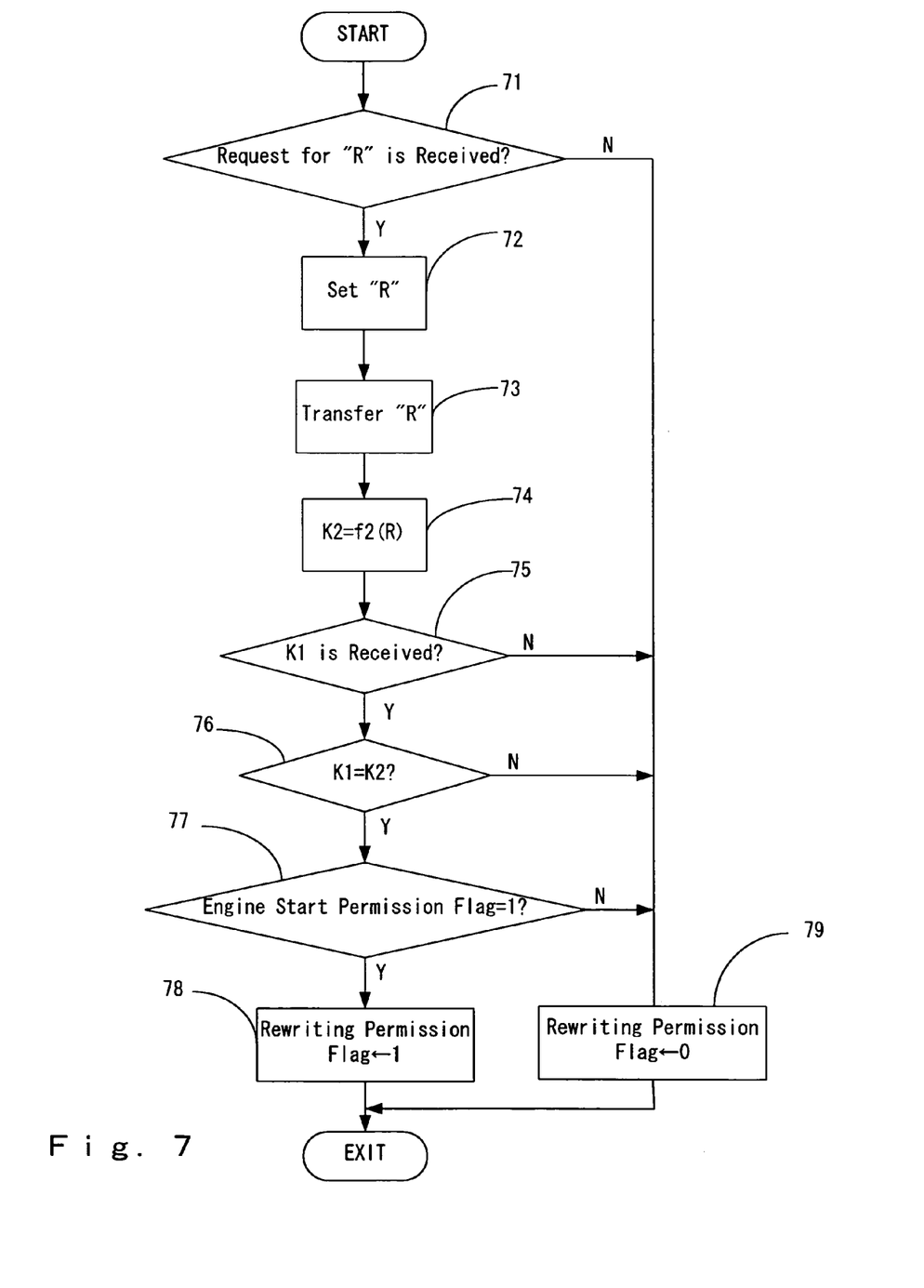
FIG. 7 is a flow chart showing a process for releasing security executed by the ECU of the memory rewriting system according to one embodiment of the present invention.

FIG. 7 is a flow chart showing a process for releasing security executed by the ECU 10. The ECU 10 receives the request for the number R from the rewriting device 11. Upon receiving the request, the ECU 10 sets the number R from random numbers (step 72) and transfers it to the rewriting device 11 (step 73). The ECU then calculates the function value K2 for the number R using the security function $f_2$ already retained therein (step 74).

The ECU 10 receives the function value K1 from the rewriting device 11 (step 75) and compares the value K1 with the value K2 (step 76). If they are equal, the ECU 10 checks whether the engine start permission flag is one (step 77). If the flag is one, the process proceeds to step 78 to set a rewriting permission flag, thereby indicating that the rewriting device 11 is permitted for rewriting. If the values are unequal at step 76 or the engine start permission flag is not set to a value of one at step 77, then the rewriting permission flag is set to zero (step 79) to indicate that the rewriting device is not permitted for rewriting.

Figure 8:
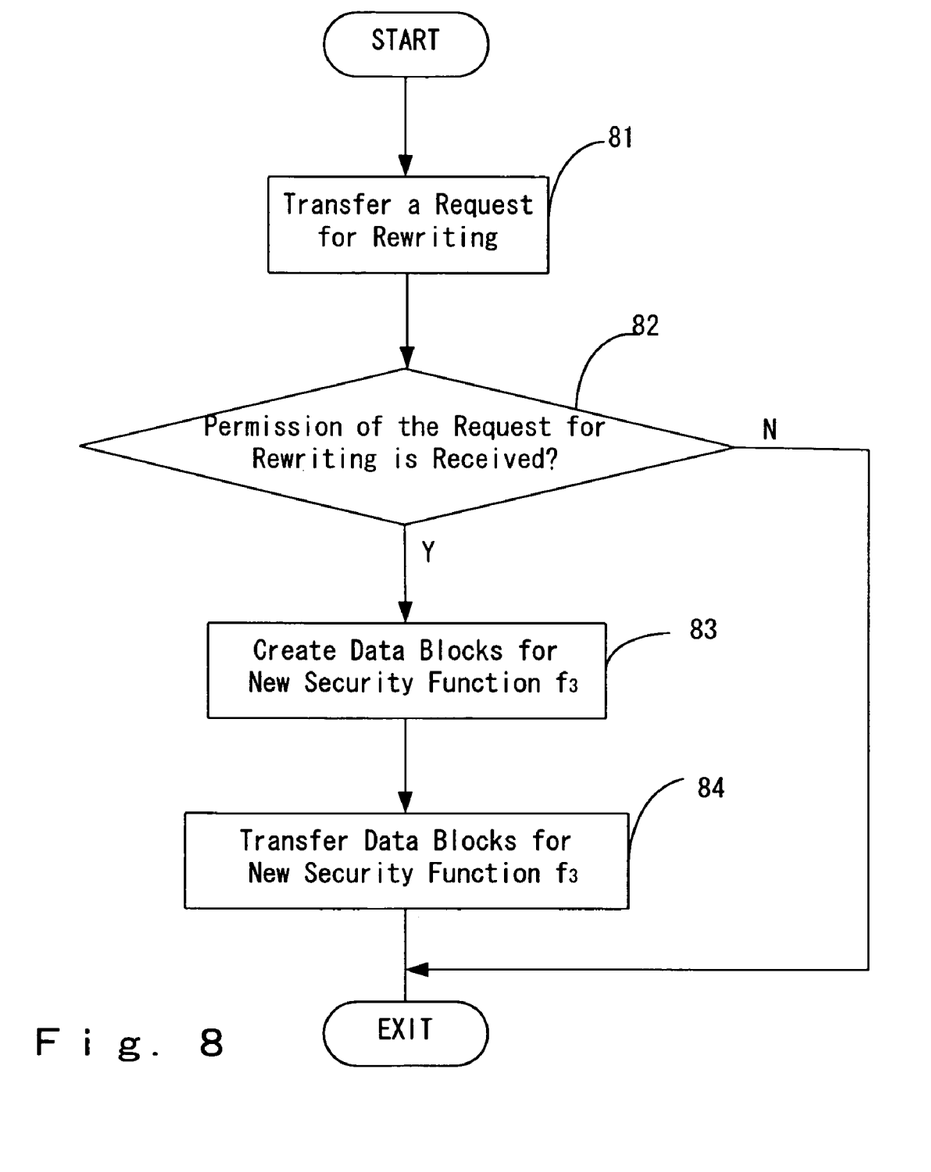
FIG. 8 is a flow chart showing a process for rewriting executed by the rewriting device of the memory rewriting system according to one embodiment of the present invention.

FIG. 8 is a flow chart of a process for rewriting executed by the rewriting device 11. At step 81, the rewriting device 11 transfers a request for rewriting to the ECU 10. The request may actually include the notification for a start of rewriting, the request for shifting to the rewriting operation mode, and the like, as shown in FIG. 4. Upon receiving a permission of rewriting provided by the ECU 10 in response to the request for rewriting (step 82), the rewriting device 11 creates data blocks of the new security function $f_3$ (step 83). The new security function $f_3$ can be arbitrarily created using the rewriting device 11 as described above. The rewriting device 11 then transfers the data blocks representative of the new security function $f_3$ to the ECU 10 (step 84).

Figure 9:
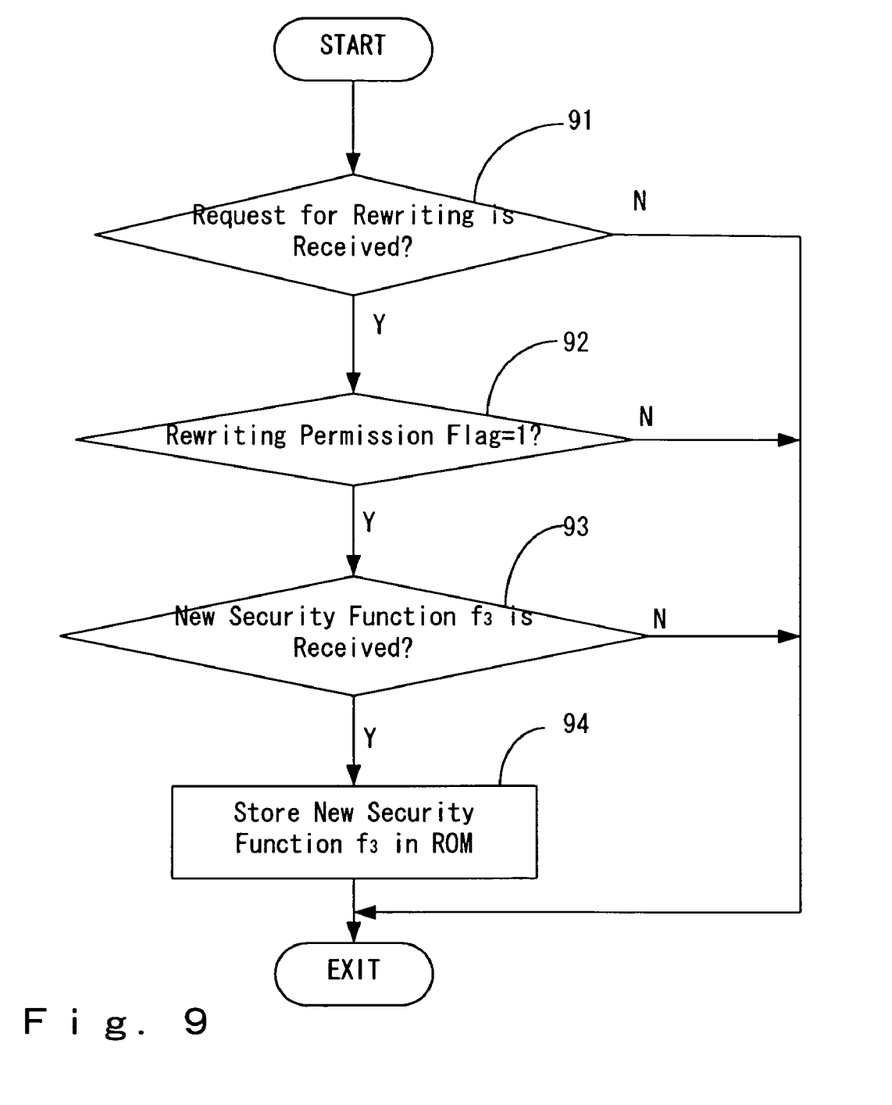
FIG. 9 is a flow chart showing a process for rewriting executed by the ECU of the memory rewriting system according to one embodiment of the present invention.

FIG. 9 is a flow chart showing a process for rewriting executed by the ECU 10. Upon receiving the request for rewriting from the rewriting device 11 (step 91), the ECU 10 checks whether the rewriting permission flag is set to one (step 92). If the flag is set to one, which means that the rewriting device 11 has been proved to be authentic, then the ECU waits for the new security function $f_3$ transferred from the rewriting device 11. In fact, processes such as shifting to the rewriting operation mode or deletion of the current security function $f_2$ from the rewritable ROM as shown in FIG. 4 can be executed between steps 92 and 93,.

Subsequently, upon receiving the new security function $f_3$ (step 93), the ECU writes this function $f_3$ to the rewritable ROM 16. Thus, the security function $f_2$, which has been stored in the rewritable ROM 16, is rewritten with the new security function $f_3$.

What is claimed is:

1. A vehicle controller comprising,
a rewritable memory configured to store a security function expressible as a first algebraic equation used to authenticate an external rewriting device to determine whether rewriting to the rewritable memory by the external rewriting device is permitted;
a controller configured to initiate an authentication process to authenticate the external rewriting device by comparing a result of the security function with a security feature of the external rewriting device in response to a request from the external rewriting device to rewrite data held by the rewritable memory and upon authenticating the external rewriting device to delete the security function stored in the rewritable memory and to write a new security function into the rewritable memory; and
an interface configured to receive and transmit one or more signals between the controller and the external rewriting device,
wherein the new security function is different from the deleted security function.

2. The vehicle controller of claim 1, wherein a program for deleting the security function and writing the new security function is stored in a non-rewritable memory.

3. The vehicle controller of claim 1, wherein an anti-theft system is connected to the vehicle controller; and
wherein rewriting to the rewritable memory is permitted if the anti-theft system permits an operation as to the vehicle.

4. The vehicle controller of claim 1, wherein the rewritable memory is implemented in any form of a flash memory, EPROM and EEPROM.

5. The vehicle controller of claim 2, wherein the rewritable memory and the non-rewritable memory are implemented in a single memory.

6. A method for rewriting data stored in a rewritable memory in a vehicle controller, the method comprising;
receiving a result of a second security function expressible as an algebraic equation from an external rewriting device in communication with the vehicle controller,
deleting at the vehicle controller a first security function expressible as an algebraic equation stored in the rewritable memory,
determining whether rewriting to the rewritable memory is permitted by the external rewriting device using a result of the first security function, and
if permitted, writing a third security function expressible as an algebraic equation into the rewritable memory,
wherein the third security function is different from the first security function.

7. The method of claim 6, the deleting the first security function and the writing the third security function are performed by a program stored in a non-rewritable memory mounted on the vehicle controller.

8. The method of claim 6, wherein an anti-theft system is connected to the vehicle controller, and
wherein rewriting to the rewritable memory is permitted if the anti-theft system permits an operation as to the vehicle.

9. The method of claim 6, wherein the external rewriting device stores the second security function; and
wherein the determination of the permission for rewriting to the rewritable memory comprising:
comparing the first security function with the second security function transferred from the rewriting device;
permitting rewriting to the rewritable memory if the first security function matches the second security function.

10. The method of claim 9, wherein the first security function and the second security function have equivalent expressions;
wherein the determination of the permission for rewriting to the rewritable memory comprising:
calculating a first function value for a number based on the function of the first security data in the vehicle controller;
calculating a second function value for the number based on the function of the second security data in the rewriting device;
comparing the first function value with the second function value; and
permitting the rewriting device to rewrite to the rewritable memory if the first function value is equal to the second function value.

11. A memory rewriting system for a vehicle controller comprising:
a vehicle controller comprising a rewritable memory, the rewritable memory storing second security data; and
a rewriting device for storing first security data,
wherein the vehicle controller is configured to;

determine whether there is a predetermined relationship between the first security data received from the rewriting device and the second security data stored in the rewritable memory;

release a security feature that prevents the rewritable memory from being rewritten if it is determined that there is the predetermined relationship therebetween;

delete the second security data after release of the security feature; and write third security data received from the rewriting device, different from the first security data, into the rewritable memory, the rewriting device being suitable for additionally storing the third security data.

* * * * *